US012618948B2

(12) United States Patent
Muramatsu

(10) Patent No.: US 12,618,948 B2
(45) Date of Patent: May 5, 2026

(54) PHOTODETECTION DEVICE

(71) Applicant: HAMAMATSU PHOTONICS K.K., Hamamatsu (JP)

(72) Inventor: Masanori Muramatsu, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 783 days.

(21) Appl. No.: 18/016,059

(22) PCT Filed: Jul. 14, 2021

(86) PCT No.: PCT/JP2021/026438
§ 371 (c)(1),
(2) Date: Jan. 13, 2023

(87) PCT Pub. No.: WO2022/019189
PCT Pub. Date: Jan. 27, 2022

(65) Prior Publication Data
US 2023/0273299 A1      Aug. 31, 2023

(30) Foreign Application Priority Data
Jul. 22, 2020      (JP) ................................. 2020-125645

(51) Int. Cl.
*G01S 7/481*          (2006.01)
*H10F 39/00*          (2025.01)
(52) U.S. Cl.
CPC .......... *G01S 7/4816* (2013.01); *H10F 39/804* (2025.01)

(58) Field of Classification Search
CPC ........ G01J 2001/4466; G01J 2001/446; H10F 77/959; H10F 30/225; H04N 25/773;
(Continued)

(56) References Cited

U.S. PATENT DOCUMENTS

2016/0003674 A1*   1/2016  Sanson ..................... G01J 1/46
                                                                          356/215
2017/0301719 A1*  10/2017  Iwata ..................... H04N 25/78
(Continued)

FOREIGN PATENT DOCUMENTS

CN          101023330 A        8/2007
CN          108885251 A        11/2018
(Continued)

OTHER PUBLICATIONS

International Preliminary Report on Patentability mailed Feb. 2, 2023 for PCT/JP2021/026438.

*Primary Examiner* — Kenneth J Malkowski
(74) *Attorney, Agent, or Firm* — Faegre Drinker Biddle & Reath LLP

(57)          ABSTRACT

A first terminal is connected to a first electrode of an APD. First and second circuit units and are connected in parallel with each other to a second electrode of the APD. A second terminal is connected to the second electrode via the first circuit unit. A third terminal is connected to the second electrode via the second circuit unit. A first switch, a resistor, the second electrode, and the second terminal are connected in series with each other. A second switch and a capacitor are connected in parallel with each other to the second electrode. The second switch, the second electrode, and a third terminal are connected in series with each other. A TIA is connected in series with the capacitor and is connected to the second electrode via the capacitor.

13 Claims, 9 Drawing Sheets

(58) Field of Classification Search
    CPC ...... H04N 25/77; H04N 25/78; H04N 25/766;
                                                    G01S 7/4863
    See application file for complete search history.

(56)                    References Cited

U.S. PATENT DOCUMENTS

2022/0026536 A1 *  1/2022  Ozawa .................... G01S 17/08
2022/0344521 A1 *  10/2022  Luo .......................... G01J 1/44

FOREIGN PATENT DOCUMENTS

| | | | |
|---|---|---|---|
| JP | H02-263123 | A | 10/1990 |
| JP | 2016-225453 | A | 12/2016 |
| JP | 2018-044923 | A | 3/2018 |
| JP | 2019-009768 | A | 1/2019 |
| JP | 2019-518200 | A | 6/2019 |
| JP | 2020-016654 | A | 1/2020 |
| JP | 2021-082973 | A | 5/2021 |
| WO | WO-2017/180277 | A1 | 10/2017 |
| WO | WO-2020/045125 | A1 | 3/2020 |
| WO | WO-2020/059488 | A1 | 3/2020 |

* cited by examiner

*Fig.3*

PHOTODETECTION DEVICE

TECHNICAL FIELD

The present invention relates to a photodetection device.

BACKGROUND ART

A photodetection device including a plurality of light reception regions has been known (for example, Patent Literature 1). In Patent Literature 1, a field effect transistor is connected in series with a photodiode that forms a light reception region. An energized state of the photodiode is switched by a switch using this field effect transistor. As a result, the photodiode to be used is selected.

CITATION LIST

Patent Literature

Patent Literature 1: Japanese Unexamined Patent Publication No. 2018-44923

SUMMARY OF INVENTION

Technical Problem

When an avalanche photodiode is used as a photodiode forming a light reception region, a bias voltage is applied to the avalanche photodiode. When light enters the avalanche photodiode while the bias voltage is being applied, the avalanche photodiode multiplies and outputs electrons generated in response to the incident light. At this time, the avalanche photodiode generates heat. As the bias voltage increases, the amount of heat generated by the avalanche photodiode increases. As the number of avalanche photodiodes in a photodetection device increases, the amount of heat generated in the photodetection device increases. In a photodetection device that uses a plurality of avalanche diodes, there is a risk that detection accuracy will decrease due to heat generation in each avalanche photodiode. Depending on the number of avalanche photodiodes in the photodetection device, the value of the bias voltage, and the amount of incident light, the photodetection device may be damaged by the heat generation.

Even when light to be measured is not incident, the avalanche photodiode can generate heat due to incidence of environmental light such as sunlight. Therefore, it is conceivable to suppress the heat generation by stopping application of the bias voltage to an avalanche photodiode which the light to be measured does not enter. For example, in the photodetection device disclosed in Patent Literature 1, application of the bias voltage to the photodiode is stopped by breaking electrical connection to the photodiode that forms the light reception region. Specifically, a switch connected in series with the photodiode is switched between a conductive state and a cutoff state. In the conductive state, in which the switch is conducting, the bias voltage is applied to the avalanche photodiode. In the cutoff state, in which the switch is cut off, no bias voltage is applied to the avalanche photodiode.

In this photodetection device, a voltage corresponding to the bias voltage applied to the avalanche photodiode is applied to a reading circuit for reading a signal from the avalanche photodiode. Therefore, even when the heat generation is suppressed, the reading circuit in the photodetection device may be damaged due to fluctuation in a potential applied to the reading circuit in response to switching between the conductive state and the cutoff state by the switch.

An object of each aspect of the invention is to provide a photodetection device capable of suppressing heat generation of an avalanche photodiode due to incident light and damage to a reading circuit due to voltage fluctuation.

Solution to Problem

A photodetection device in one aspect of the invention includes a plurality of photodetection units each having a light reception region. Each of the photodetection unit includes an avalanche photodiode, a first terminal, first and second circuit units, a second terminal, and a third terminal. The avalanche photodiode includes first and second electrodes and forms the light reception region. The first terminal is connected to the first electrode. A first potential is applied to the first terminal. The first circuit unit and the second circuit unit are connected in parallel with each other to the second electrode. The second terminal is connected to the second electrode via the first circuit unit. A second potential is applied to the second terminal. The third terminal is connected to the second electrode via the second circuit unit. A third potential is applied to the third terminal. In each of the photodetection units, the first circuit unit includes a first switch and a resistor, and the second circuit unit includes a second switch, a capacitor, and a reading circuit. The first switch switches a connection state between the second electrode and the second terminal. The first switch, the resistor, the second electrode, and the second terminal are connected in series with each other. The second switch switches a connection state between the second electrode and the third terminal. The reading circuit includes a transimpedance amplifier. The second switch and the capacitor are connected in parallel with each other to the second electrode. The second switch, the second electrode, and the third terminal are connected in series with each other. The transimpedance amplifier is connected in series with the capacitor and is connected to the second electrode via the capacitor. An absolute value of a potential difference between the first potential and the third potential is smaller than an absolute value of a potential difference between the first potential and the second potential.

In the one aspect, the first terminal is connected to the first electrode of the avalanche photodiode. The first switch switches a connection state between the second electrode of the avalanche photodiode and the second terminal. The second switch switches a connection state between the second electrode of the avalanche photodiode and the third terminal. Therefore, this photodetection device can switch a bias voltage to the avalanche photodiode from the potential difference between the first potential applied to the first terminal and the second potential applied to the second terminal to the potential difference between the first potential applied to the first terminal and the third potential applied to the third terminal. As a result, heat generation of the avalanche photodiode due to incident light and damage to the reading circuit due to voltage fluctuation are suppressed.

In the one aspect, in each of the photodetection units, the first switch may be connected to the second electrode via the resistor. In this case, an influence of parasitic capacitance generated in the first switch is reduced.

In the one aspect, the photodetection device may further include a switch control unit configured to control a connection state by the first and second switches according to timing of photodetection in each of the photodetection units. In this case, the photodetection device can switch the bias voltage to the avalanche photodiode depending on whether or not it is the timing to perform photodetection.

In the one aspect, the switch control unit may cause the second switch to connect the second electrode and the third terminal to each other in a state in which the first switch disconnects the second electrode and the second terminal from each other. In this case, when ambient light enters the avalanche photodiode that does not detect the light to be measured, the photodetection device can discharge a generated current to the third terminal. As a result, damage to the reading circuit is suppressed.

In the one aspect, the switch control unit may cause the second switch to disconnect the second electrode and the third terminal from each other in a state in which the first switch connects the second electrode and the second terminal to each other. In this case, heat generation in the resistor is suppressed.

In the one aspect, the photodetection device may further include an irradiation unit that applies light. The switch control unit may control the energized states of the first and second switches according to the timing at which light is applied from the irradiation unit. In this case, the photodetection device can more reliably determine whether or not it is the timing to perform photodetection. As a result, the photodetection device can more accurately switch the bias voltage to the avalanche photodiode depending on whether or not it is the timing to perform photodetection.

A photodetection device in another aspect of the invention includes a plurality of photodetection units each having a light reception region. Each of the photodetection unit includes an avalanche photodiode, a first terminal, first and second circuit units, a second terminal, and a third terminal. The avalanche photodiode includes first and second electrodes and forms the light reception region. The first terminal is connected to the first electrode. A first potential is applied to the first terminal. The first circuit unit and the second circuit unit are connected in parallel with each other to the second electrode. The second terminal is connected to the second electrode via the first circuit unit. A second potential is applied to the second terminal. The third terminal is connected to the second electrode via the second circuit unit. A third potential is applied to the third terminal. In each of the photodetection units, the first circuit unit includes a resistor and a switch, and the second circuit unit includes a diode, a capacitor, and a reading circuit. The switch switches a connection state between the second electrode and the second terminal. The switch, the resistor, the second electrode, and the second terminal are connected in series with each other.

The reading circuit includes a transimpedance amplifier. The diode and the capacitor are connected in parallel with each other to the second electrode. The diode includes a third electrode and a fourth electrode. The third electrode has the same polarity as the first electrode of the avalanche photodiode. The fourth electrode has the same polarity as the second electrode of the avalanche photodiode. The third electrode is connected to the third terminal. The fourth electrode is connected to the second electrode. An anode of the diode is connected to the third terminal. The transimpedance amplifier is connected in series with the capacitor and is connected to the second electrode via the capacitor. An absolute value of a potential difference between the first potential and the third potential is smaller than an absolute value of a potential difference between the first potential and the second potential.

In the other aspect, the first terminal is connected to the first electrode of the avalanche photodiode. The switch switches a connection state between the second electrode of the avalanche photodiode and the second terminal. The fourth electrode of the diode is connected to the second electrode, and the third electrode of the diode is connected to the third terminal. The fourth electrode has the same polarity as the second electrode. The third electrode has the same polarity as the first electrode. Therefore, this photodetection device can switch a bias voltage to the avalanche photodiode from the potential difference between the first potential applied to the first terminal and the second potential applied to the second terminal to the potential difference between the first potential applied to the first terminal and the third potential applied to the third terminal. As a result, heat generation of the avalanche photodiode due to incident light and damage to the reading circuit due to voltage fluctuation are suppressed.

In the other aspect, in the photodetection unit, the switch may be connected to the second electrode via the resistor. In this case, an influence of parasitic capacitance generated in the switch is reduced.

In each of the aspects, the transimpedance amplifier may be included in a CMOS logic integrated circuit. When the transimpedance amplifier is included in the CMOS logic integrated circuit, the transimpedance amplifier can operate at a relatively high speed. However, in the CMOS logic integrated circuit, a range of an operating voltage is limited. With the above configuration, the bias voltage applied to the avalanche photodiode can be changed while the voltage applied to the CMOS logic integrated circuit is within the range of the operating voltage. Therefore, while an operation speed of the transimpedance amplifier is improved, heat generation of the avalanche photodiode and damage to the reading circuit due to voltage fluctuation can be suppressed.

In the other aspect, the resistor may have impedance greater than input impedance of the second circuit unit. In this case, a signal from the avalanche photodiode can be more accurately transmitted to the transimpedance amplifier.

In the other aspect, the potential difference between the first potential and the second potential and the potential difference between the first potential and the third potential may be included in the range of the operating voltage of the transimpedance amplifier. In this case, with a simple configuration, the operation speed of the transimpedance amplifier can be improved, while heat generation of the transimpedance amplifier and damage to the reading circuit due to voltage fluctuation can be suppressed.

A photodetection device in still another aspect of the invention includes a plurality of photodetection units. Each of the photodetection unit includes an avalanche photodiode, a first terminal, first and second circuit units, a second terminal, and a third terminal. The avalanche photodiode includes first and second electrodes. The first terminal is connected to the first electrode. The first circuit unit and the second circuit unit are connected in parallel with each other to the second electrode. The second terminal is connected to the second electrode via the first circuit unit. The third terminal is connected to the second electrode via the second circuit unit. In each of the photodetection units, the first circuit unit includes a first switch and a resistor, and the second circuit unit includes a second switch, a capacitor, and a reading circuit. The first switch switches a connection state between the second electrode and the second terminal. The first switch, the resistor, the second electrode, and the second terminal are connected in series with each other. The second switch switches a connection state between the second electrode and the third terminal. The reading circuit includes a transimpedance amplifier. The second switch and the capacitor are connected in parallel with each other to the second electrode. The second switch, the second electrode, and the third terminal are connected in series with each other. The transimpedance amplifier is connected in series with the capacitor and is connected to the second electrode via the capacitor.

In the still another aspect of the invention, the first terminal is connected to the first electrode of the avalanche photodiode. The first switch switches a connection state between the second electrode of the avalanche photodiode and the second terminal. The second switch switches a connection state between the second electrode of the avalanche photodiode and the third terminal. Therefore, this photodetection device can switch a bias voltage to the avalanche photodiode from a potential difference between a potential applied to the first terminal and a potential applied to the second terminal to a potential difference between the potential applied to the first terminal and a potential applied to the third terminal. As a result, heat generation of the avalanche photodiode due to incident light and damage to the reading circuit due to voltage fluctuation are suppressed.

A photodetection device in yet another aspect of the invention includes a plurality of photodetection units. Each of the photodetection unit includes an avalanche photodiode, a first terminal, first and second circuit units, a second terminal, and a third terminal. The avalanche photodiode includes first and second electrodes. The first terminal is connected to the first electrode. The first circuit unit and the second circuit unit are connected in parallel with each other to the second electrode. The second terminal is connected to the second electrode via the first circuit unit. The third terminal is connected to the second electrode via the second circuit unit. In each of the photodetection units, the first circuit unit includes a switch and a resistor, and the second circuit unit includes a diode, a capacitor, and a reading circuit. The switch switches a connection state between the second electrode and the second terminal. The switch, the resistor, the second electrode, and the second terminal are connected in series with each other. The reading circuit includes a transimpedance amplifier. The diode and the capacitor are connected in parallel with each other to the second electrode. The diode includes a third electrode and a fourth electrode. The third electrode has the same polarity as the first electrode of the avalanche photodiode. The fourth electrode has the same polarity as the second electrode of the avalanche photodiode. The third electrode is connected to the third terminal. The fourth electrode is connected to the second electrode. The transimpedance amplifier is connected in series with the capacitor and is connected to the second electrode via the capacitor.

In the yet another aspect of the invention, the first terminal is connected to the first electrode of the avalanche photodiode. The switch switches a connection state between the second electrode of the avalanche photodiode and the second terminal. A cathode of the diode is connected to the second electrode and an anode of the diode is connected to the third terminal Therefore, this photodetection device can switch a bias voltage to the avalanche photodiode from a potential difference between a potential applied to the first terminal and a potential applied to the second terminal to a potential difference between the potential applied to the first terminal and a potential applied to the third terminal. As a result, heat generation of the avalanche photodiode due to incident light and damage to the reading circuit due to voltage fluctuation are suppressed.

Advantageous Effects of Invention

Each aspect of the invention can provide a photodetection device in which heat generation of an avalanche photodiode due to incident light and damage to a reading circuit due to voltage fluctuation are suppressed.

BRIEF DESCRIPTION OF DRAWINGS

FIG. 3 is a partially enlarged view of the light reception unit.

DESCRIPTION OF EMBODIMENTS

Figure 1:
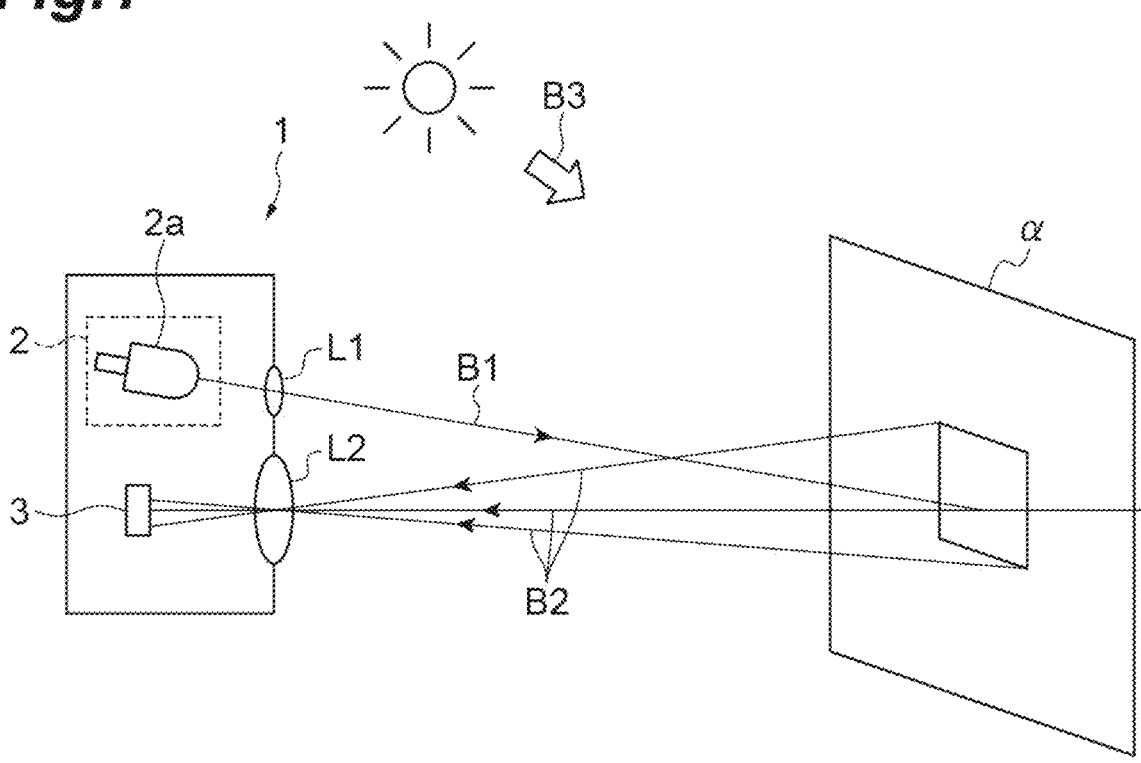
FIG. 1 is a schematic diagram of a photodetection device in an embodiment.

Hereinafter, an embodiment of the invention will be described in detail with reference to the accompanying drawings. Note that, in the description, the same reference numerals are used for the same elements or elements having the same function, and overlapping descriptions are omitted.

First, a configuration of a photodetection device in the present embodiment will be described with reference to FIG. 1. FIG. 1 is a schematic diagram illustrating the configuration of the photodetection device in the present embodiment.

A photodetection device 1 measures a distance to an object to be measured by detecting light from the object to be measured. The photodetection device 1 is included in, for example, LiDAR (Light Detection and Ranging). The photodetection device 1 includes an irradiation unit 2, a light reception unit 3, and lenses L1 and L2. The irradiation unit 2 includes a light source 2a. The irradiation unit 2 applies laser light B1 using, for example, the light source 2a. The laser light B1 emitted from the irradiation unit 2 passes through the lens L1 and is applied to, for example, an object a. Light reflected by the object a passes through the lens L2 and enters the light reception unit 3 as light to be measured B2. The light reception unit 3 detects the incident light to be measured B2. In addition to the light to be measured B2, ambient light B3 enters the light reception unit 3. The ambient light B3 is, for example, sunlight.

Figure 2:
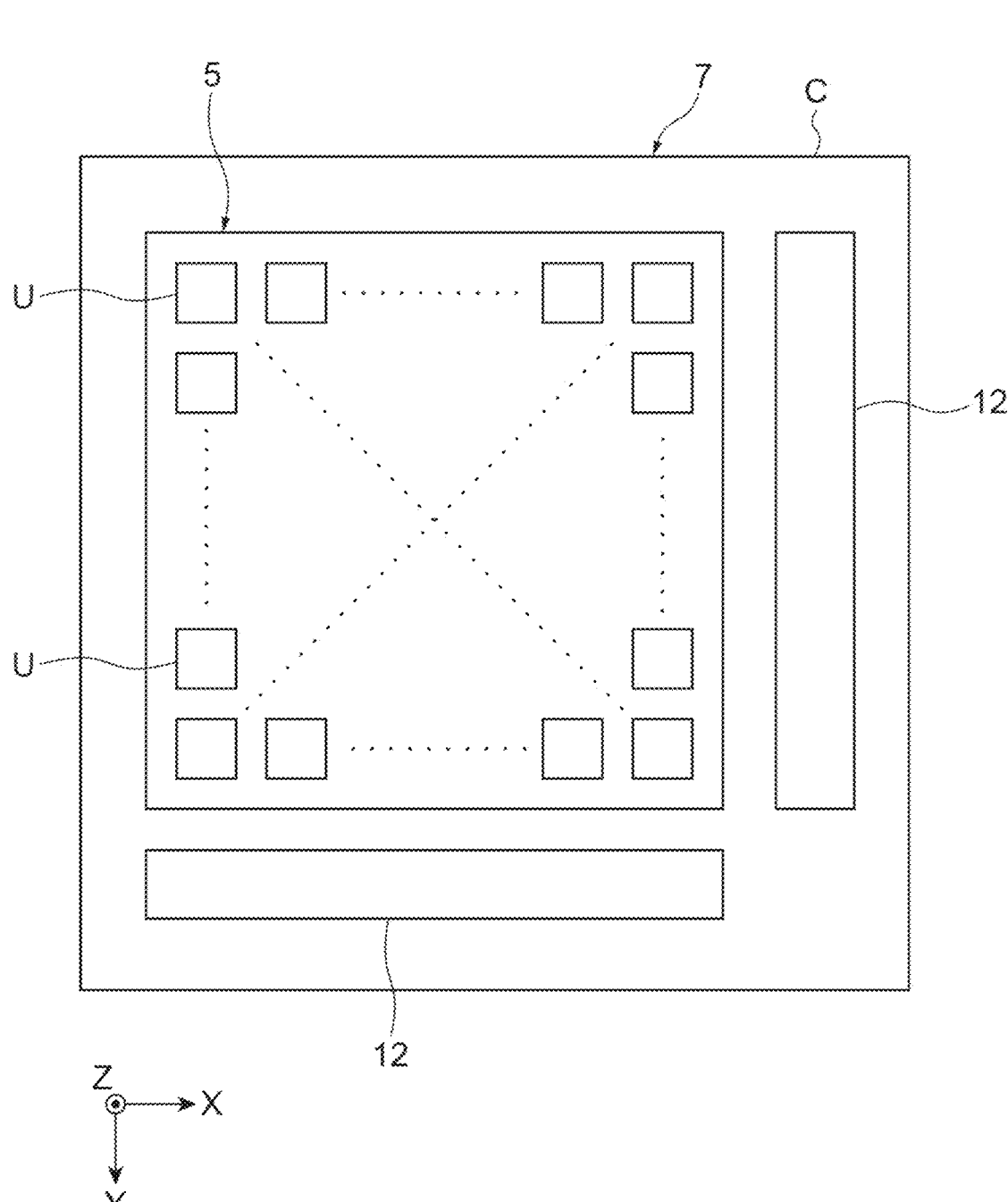
FIG. 2 is a schematic diagram of a light reception unit included in the photodetection device.
Figure 3:
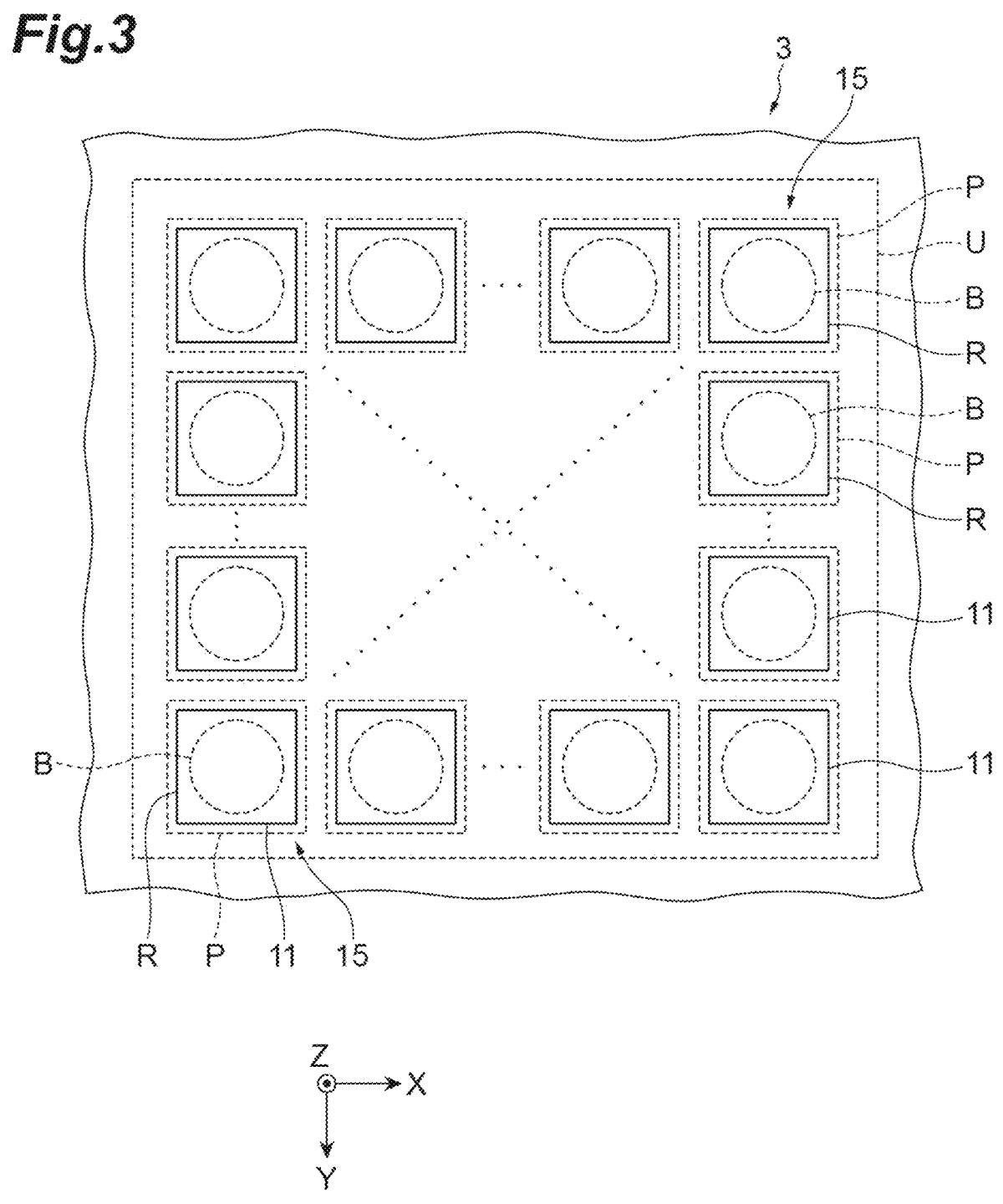

Next, a configuration of the light reception unit 3 will be described with reference to FIGS. 2 and 3. FIG. 2 is a schematic diagram of the light reception unit 3 included in the photodetection device. FIG. 3 is a partially enlarged view of the light reception unit 3.

The light reception unit 3 includes a photodetection substrate 5 and a circuit element 7. The photodetection substrate 5 and the circuit element 7 are joined together. In the present embodiment, the photodetection substrate 5 and the circuit element 7 face each other. In the present embodiment, a facing direction of the photodetection substrate 5 and the circuit element 7 corresponds to a Z-axis direction. Each of the photodetection substrate 5 and the circuit element 7 has a rectangular shape extending in an XY-axis direction when viewed in the Z-axis direction. The photodetection substrate 5 and the circuit element 7 are connected to each other. In this specification, unless otherwise specified, the term "connection" means electrical conduction, and includes not only direct connection but also indirect connection via another member. "Connected" includes a configuration in which different elements are temporarily electrically isolated by separately providing a switch, etc. between the elements. "Joined" means physically connected regardless of electrical connection, and includes not only direct connection but also indirect connection via another member.

The circuit element 7 includes an integrated circuit C. In the present embodiment, the circuit element 7 includes only one integrated circuit C. The circuit element 7 may include a plurality of integrated circuits C. The integrated circuit C is a CMOS logic integrated circuit. The circuit element 7 processes a signal output from the photodetection substrate 5 in the integrated circuit C. A range of an operating voltage of the integrated circuit C is, for example, 20 V or less.

The circuit element 7 includes a port 12. The port 12 includes a plurality of electrodes. The photodetection substrate 5 and circuit element 7 operate according to a voltage applied to the port 12. The circuit element 7 processes a signal output from the photodetection substrate 5 and outputs the processed signal to the outside of the circuit element 7 from the port 12.

The photodetection substrate 5 and the circuit element 7 include a plurality of signal output units U. In the present embodiment, the plurality of signal output units U is two-dimensionally arranged in the XY-axis direction. In a modified example of the present embodiment, the plurality of signal output units U may be arranged in a line. As illustrated in FIG. 3, the light reception unit 3 includes a plurality of photodetection units 15. Each of the signal output units U includes a plurality of photodetection units 15. As a modified example of the present embodiment, each signal output unit U may include only one photodetection unit 15.

In the present embodiment, the light reception unit 3 detects light at different timing for each signal output unit U. As a modified example of the present embodiment, the light reception unit 3 may detect light at different timing for each column or each row of the signal output unit U. The light reception unit 3 may detect light at the same timing in all the signal output units U. A plurality of photodetection units 15 included in one signal output unit U detects light at the same timing.

Each photodetection unit 15 has a light reception region R. The light reception unit 3 detects light entering each light reception region R. The photodetection substrate 5 converts light entering the light reception region R into electrons and transmits a signal corresponding to the electrons to the circuit element 7. In the present embodiment, each light reception region R is formed by one avalanche photodiode 11. Hereinafter, the "avalanche photodiode" will be referred to as "APD." Each APD 11 is included in the photodetection substrate 5. Each APD 11 is connected to the circuit element 7.

Each photodetection unit 15 includes a plurality of signal processing units P that processes a signal output from at least one APD 11. Each signal processing unit P is included in the circuit element 7. Each signal processing unit P is included in the integrated circuit C. In the present embodiment, one integrated circuit C includes a plurality of signal processing units P. The circuit element 7 performs processing related to a signal transmitted from the photodetection substrate 5 in each signal processing unit P.

Each APD 11 forming the light reception region R is connected to a signal processing unit P corresponding to each APD 11. In the present embodiment, as illustrated in FIG. 3, one signal processing unit P corresponds to one light reception region R. One APD 11 is connected to one signal processing unit P through one bump B. In other words, the signal processing unit P and the APD 11 are connected in a one-to-one relationship.

Figure 4:
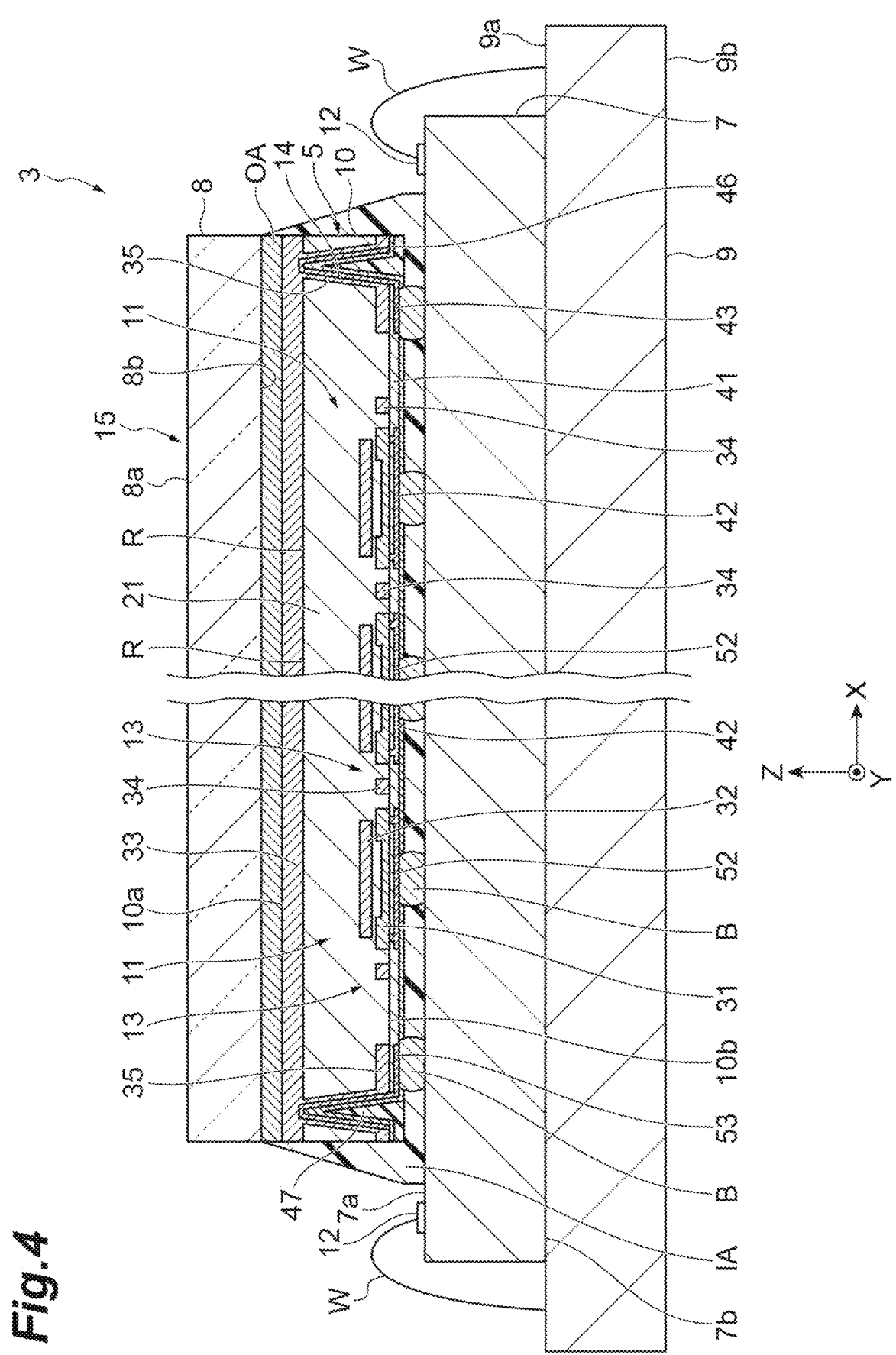
FIG. 4 is a cross-sectional view of the light reception unit.

Next, an example of a configuration of the light reception unit 3 will be described in detail with reference to FIG. 4. FIG. 4 is a cross-sectional view of the light reception unit. In the present embodiment, the light reception unit 3 is a backside incident type semiconductor photodetection device.

The light reception unit 3 includes a glass substrate 8 and a mounting substrate 9 in addition to the photodetection substrate 5 and the circuit element 7. In the present embodiment, a plane parallel to each main surface of the photodetection substrate 5, the circuit element 7, the glass substrate 8, and the mounting substrate 9 corresponds to an XY-axis plane, and a direction orthogonal to each main surface corresponds to the Z-axis direction. The glass substrate 8 faces the photodetection substrate 5. The photodetection substrate 5 is disposed between the circuit element 7 and the glass substrate 8. The mounting substrate 9 faces the circuit element 7. The circuit element 7 is disposed between the photodetection substrate 5 and the mounting substrate 9.

The photodetection substrate 5 includes a semiconductor substrate 10 having a rectangular shape in a plan view. The semiconductor substrate 10 is made of Si and is a P-type semiconductor substrate. The semiconductor substrate 10 includes a main surface 10a and a main surface 10b facing each other. The main surface 10a is a surface where light enters the semiconductor substrate 10.

The circuit element 7 includes a main surface 7a and a main surface 7b facing each other. The circuit element 7 has a rectangular shape in a plan view. The photodetection substrate 5 is connected to the circuit element 7. The main surface 7a and the main surface 10b face each other. The photodetection substrate 5 and the circuit element 7 are joined by an adhesive layer IA. The adhesive layer IA has insulating properties. The photodetection substrate 5 and the circuit element 7 are physically and electrically connected by a plurality of bumps B. The main surfaces 7a and 7b of the circuit element 7 are larger than the main surfaces 10a and 10b of the semiconductor substrate 10. An edge of the circuit element 7 surrounds an edge of the photodetection substrate 5 when viewed in the Z-axis direction.

The glass substrate 8 includes a main surface 8a and a main surface 8b facing each other. The glass substrate 8 has a rectangular shape in a plan view. The main surface 8b faces the main surface 10a of the semiconductor substrate 10. The main surface 8a and the main surface 8b are flat. The glass substrate 8 and the photodetection substrate 5 are optically joined using an optical adhesive OA. The glass substrate 8 may be directly formed on the photodetection substrate 5.

The mounting substrate 9 includes a main surface 9a and a main surface 9b facing each other. The main surface 9a faces the main surface 7b of the circuit element 7. The main surface 9a of the mounting substrate 9 is larger than each of the main surfaces 8a and 8b of the circuit element 7. An edge of the mounting substrate 9 surrounds the edge of the circuit element 7 when viewed in the Z-axis direction. The circuit element 7 and the mounting substrate 9 are connected by a bonding wire W. The mounting substrate 9 is connected to the port 12 via the bonding wire W.

The semiconductor substrate 10 includes a plurality of APDs 11. The plurality of APDs 11 is two-dimensionally arranged in a matrix when viewed in the Z-axis direction. Each APD 11 forms the light reception region R on the main surface 10a. The semiconductor substrate 10 includes a peripheral carrier absorption portion 13 in addition to the APDs 11. A part of the peripheral carrier absorption portion 13 is positioned between APDs 11 adjacent to each other when viewed in the Z-axis direction. The peripheral carrier absorption portion 13 is disposed in a lattice shape when viewed in the Z-axis direction. The peripheral carrier absorption portion 13 surrounds the APD 11. The peripheral carrier absorption portion 13 is a region that absorbs carriers located in the periphery.

As illustrated in FIG. 4, the semiconductor substrate 10 includes a semiconductor region 21 and semiconductor layers 31, 32, 33, and 34. Each of the plurality of APDs 11 includes the semiconductor region 21 and the semiconductor layers 31, 32, and 33. The peripheral carrier absorption portion 13 includes the semiconductor region 21 and the semiconductor layer 34. The peripheral carrier absorption portion 13 absorbs carriers located in the periphery of the semiconductor layer 34. That is, the semiconductor layer 34 functions as a peripheral carrier absorption layer that absorbs peripheral carriers.

The semiconductor region 21 and semiconductor layers 32, 33, and 35 are of a first conductivity type, and the semiconductor layers 31 and 34 are of a second conductivity type. Impurities of a semiconductor are added using, for example, a diffusion method or an ion implantation method. In the present embodiment, the first conductivity type is P-type and the second conductivity type is N-type. When the semiconductor substrate 10 is based on Si, a Group 13 element such as B is used as a P-type impurity, and a Group 15 element such as P or As is used as an N-type impurity. In the present embodiment, the semiconductor layers 32, 33, and 35 have the same impurity concentration. The impurity concentrations of the semiconductor layers 32, 33, and 35 are higher than that of the semiconductor region 21.

The semiconductor region 21 is located on the main surface 10b side with respect to the semiconductor substrate 10. The semiconductor region 21 is included in a part of the main surface 10b. For example, the semiconductor region 21 is of P-type.

The semiconductor layer 31 is included in a part of the main surface 10b. The semiconductor layer 31 is in contact with and surrounded by the semiconductor region 21 when viewed in the Z-axis direction. For example, the semiconductor layer 31 is of $N^+$-type. In the present embodiment, the semiconductor layer 31 is included in a cathode in the APD 11.

The semiconductor layer 32 is located on the main surface 10a side with respect to the semiconductor layer 31. The semiconductor layer 32 is in contact with and surrounded by the semiconductor region 21. The semiconductor layer 32 is provided inside the semiconductor region 21. A part of the semiconductor region 21 is provided between the semiconductor layer 31 and the semiconductor layer 32. For example, the semiconductor layer 32 is of P-type. The semiconductor layer 32 is included in an avalanche region of the APD 11.

The semiconductor layer 33 is located on the main surface 10a side with respect to the semiconductor layer 32 and the semiconductor region 21. The semiconductor layer 33 is included in the entire surface of the main surface 10a. The semiconductor layer 33 is in contact with the semiconductor region 21 on the main surface 10b side. For example, the semiconductor layer 33 is of $P^+$-type. The semiconductor layer 33 is included in an anode of the APD 11.

The semiconductor layer 34 is included in a part of the main surface 10b. The semiconductor layer 34 is in contact with and surrounded by the semiconductor region 21 when viewed in the Z-axis direction. The peripheral carrier absorption portion 13 includes the semiconductor layer 34 and is in contact only with the semiconductor region 21 in the semiconductor substrate 10. The peripheral carrier absorption portion 13 does not include a layer corresponding to the avalanche region. For example, the semiconductor layer 34 is of $N^+$-type.

A groove 14 is formed in the semiconductor substrate 10. In the present embodiment, the groove 14 is provided on a side of an edge of the semiconductor substrate 10 with respect to the APD 11 when viewed in the Z-axis direction. The groove 14 does not penetrate the semiconductor substrate 10. The semiconductor layer 35 forms an edge of the groove 14 and a part of the main surface 10b. For example, the semiconductor layer 35 is of $P^+$-type. The semiconductor layer 35 is in contact with the semiconductor region 21. The semiconductor layer 35 extends in the Z-axis direction from the main surface 10b and is in contact with the semiconductor layer 33. The semiconductor layer 35 is included in the anode of the APD 11.

The photodetection substrate 5 further includes an insulating film 41, electrodes 42 and 43, a passivation film 46, and an insulating layer 47. The insulating film 41 is stacked on the main surface 10b of the semiconductor substrate 10. For example, the insulating film 41 is a silicon oxide film. The electrode 42 is disposed on the insulating film 41. The electrode 43 is disposed on the insulating film 41 and the edge of the groove 14. The passivation film 46 is disposed on the insulating film 41 and the electrodes 42 and 43. The insulating layer 47 is disposed on the passivation film 46 and fills the groove 14 to form the photodetection substrate 5 in a rectangular parallelepiped shape.

The electrode 42 penetrates the insulating film 41 and is connected to the semiconductor layer 31 of the APD 11. A part of the electrode 42 is exposed from the passivation film 46 and is included in a pad electrode 52 of the APD 11. The electrode 42 outputs a signal from the APD 11 at the pad electrode 52. The electrode 43 is connected to the semiconductor layer 35. A part of the electrode 43 is exposed from the passivation film 46 and is included in a pad electrode 53 of the APD 11. In the present embodiment, the pad electrode 52 is a pad electrode for the cathode of the APD 11. The pad electrode 53 is a pad electrode for the anode of the APD 11.

The pad electrodes 52 and 53 are joined to bumps B corresponding thereto, respectively. Each APD 11 is connected to one corresponding bump B through the pad electrode 52. The plurality of APDs 11 is connected to bumps B different from each other one by one. In other words, the APDs 11 and the bumps B are connected in a one-to-one relationship.

Figure 5:
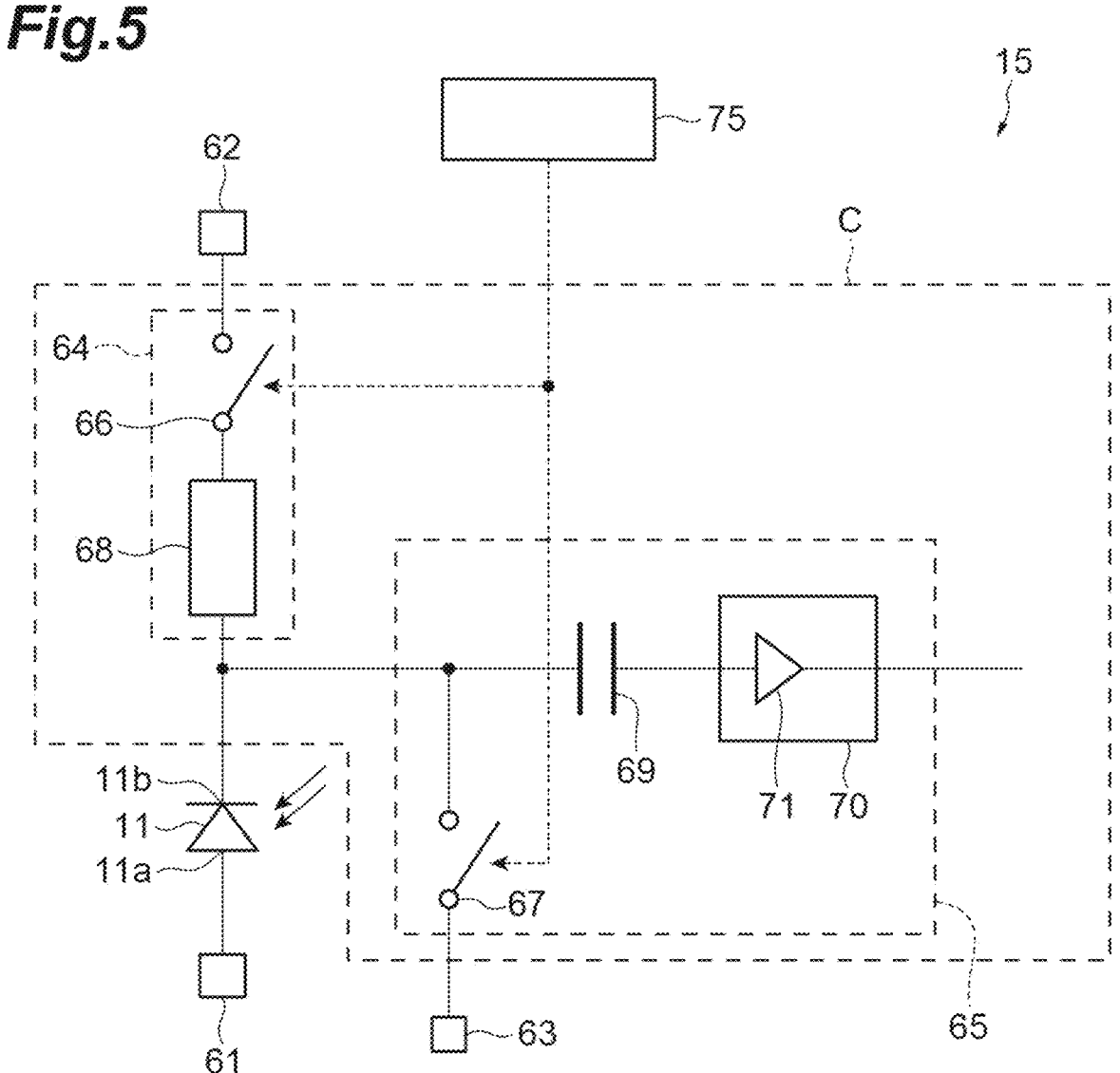
FIG. 5 is a diagram for describing a circuit of a photodetection unit.

Next, a circuit configuration of each photodetection unit 15 in the present embodiment will be described with reference to FIG. 5. FIG. 5 is a diagram for describing a circuit of the photodetection unit.

As illustrated in FIG. 5, each photodetection unit 15 includes the APD 11, a first terminal 61, a second terminal 62, a third terminal 63, a first circuit unit 64, and a second circuit unit 65. In the present embodiment, the APD 11 is included in the photodetection substrate 5. The first terminal 61, the second terminal 62, the third terminal 63, the first circuit unit 64, and the second circuit unit 65 are included in the circuit element 7. The APD 11 includes an electrode 11a and an electrode 11b. The electrode 11a is connected to the first terminal 61. The electrode 11b is connected to the first circuit unit 64 and the second circuit unit 65. When the electrode 11a corresponds to the first electrode, the electrode 11b corresponds to the second electrode.

In the present embodiment, the electrode 11a is the anode of the APD 11. The electrode 11a corresponds to a pad electrode connected to a P-type semiconductor of the APD 11. In the present embodiment, the electrode 11a corresponds to the pad electrode 53. The electrode 11b is the cathode of the APD 11. The electrode 11b corresponds to a pad electrode connected to an N-type semiconductor of the APD 11. In the present embodiment, the electrode 11b corresponds to the pad electrode 52.

The first circuit unit 64 and the second circuit unit 65 are connected in parallel with each other to the electrode 11b. The second terminal 62 is connected to the electrode 11b via the first circuit unit 64. The third terminal 63 is connected to the electrode 11b via the second circuit unit 65.

The first circuit unit 64 includes a switch 66 and a resistor 68. The switch 66 corresponds to a first switch. The switch 66 switches a connection state between the electrode 11b and the second terminal 62. The switch 66 switches the connection state between the electrode 11b and the second terminal 62 by switching between a conductive state and a cutoff state. The "conductive state" is a state in which a plurality of connected wires is connected to each other. That is, the conductive state is an ON state. The "cutoff state" is a state in which a plurality of wires connected to each other is electrically disconnected. That is, the cutoff state is an OFF state. The switch 66, the resistor 68, the electrode 11b, and the second terminal 62 are connected in series with each other. In other words, the switch 66 and the resistor 68 are inserted in series between the electrode 11b and the second terminal 62. In the present embodiment, the switch 66 is connected to the electrode 11b via the resistor 68. The resistor 68 has impedance greater than input impedance of the second circuit unit 65.

The second circuit unit 65 includes a switch 67, a capacitor 69, and a reading circuit 70. The switch 67 corresponds to a second switch. The reading circuit 70 includes a transimpedance amplifier 71. Hereinafter, the "transimpedance amplifier" will be referred to as "TIA." The switch 67 switches a connection state between the electrode 11b and the third terminal 63. The switch 67 switches the connection state between the electrode 11b and the third terminal 63 by switching between a conductive state and a cutoff state. The switch 67 and the capacitor 69 are connected in parallel with each other to the electrode 11b. The electrode 11b, the switch 67, and the third terminal 63 are connected in series with each other. In other words, the switch 67 is inserted between the electrode 11b and the third terminal 63. A TIA 71 is connected in series with the capacitor 69. The TIA 71 is connected to the electrode 11b via the capacitor 69. The capacitor 69 has input impedance lower than input impedance of the TIA 71. Impedance of the resistor 68 is greater than input impedance of each of the capacitor 69 and the TIA 71.

The switch 66 and the switch 67 are, for example, field effect transistors. The switch 66 and the switch 67 are, for example, MOS-FETs. The switch 66 and the switch 67 switch between a conductive state and a cutoff state according to voltage application.

In the present embodiment, the switch 66, the resistor 68, the switch 67, the capacitor 69, and the TIA 71 are included in one integrated circuit C. The switch 66, the resistor 68, the switch 67, the capacitor 69, and the TIA 71 may be included in different integrated circuits, respectively. At least the TIA 71 is included in a CMOS logic integrated circuit.

The light reception unit 3 further includes a switch control unit 75. The switch control unit 75 controls each of the switch 66 and the switch 67. The switch control unit 75 controls a connection state by the switch 66 and the switch 67 according to timing of photodetection in each photodetection unit 15. In the present embodiment, the switch control unit 75 controls the connection state by the switch 66 and the switch 67 according to timing at which the laser light B1 is applied from the irradiation unit 2. The switch control unit 75 switches between the conductive state and the cutoff state of the switch 66. The switch control unit 75 switches between the conductive state and the cutoff state of the switch 66.

For example, the switch control unit 75 includes a computer. This computer includes a CPU (Central Processing Unit), a main storage unit, an auxiliary storage unit, a communication control unit, an input device, and an output device. The switch control unit 75 includes one or a plurality of computers including this hardware and software such as a program.

In the present embodiment, the switch control unit 75 is provided in the circuit element 7. As a modified example of the present embodiment, the switch control unit 75 may be provided on the mounting substrate 9 separately from the circuit element 7. As a further modified example of the present embodiment, the switch control unit 75 may be provided outside the light reception unit 3.

Figure 6:
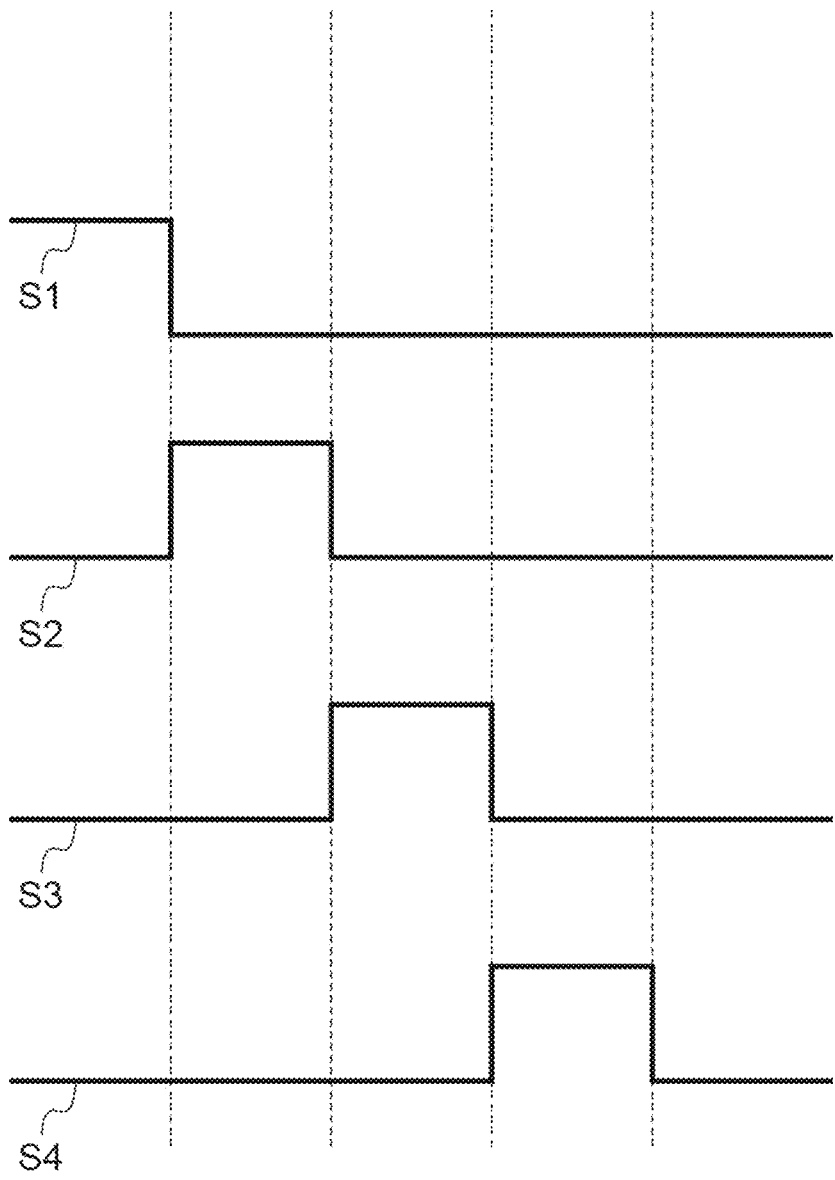
FIG. 6 is a timing chart of control signals of photodetection units different from each other.
Figure 7:
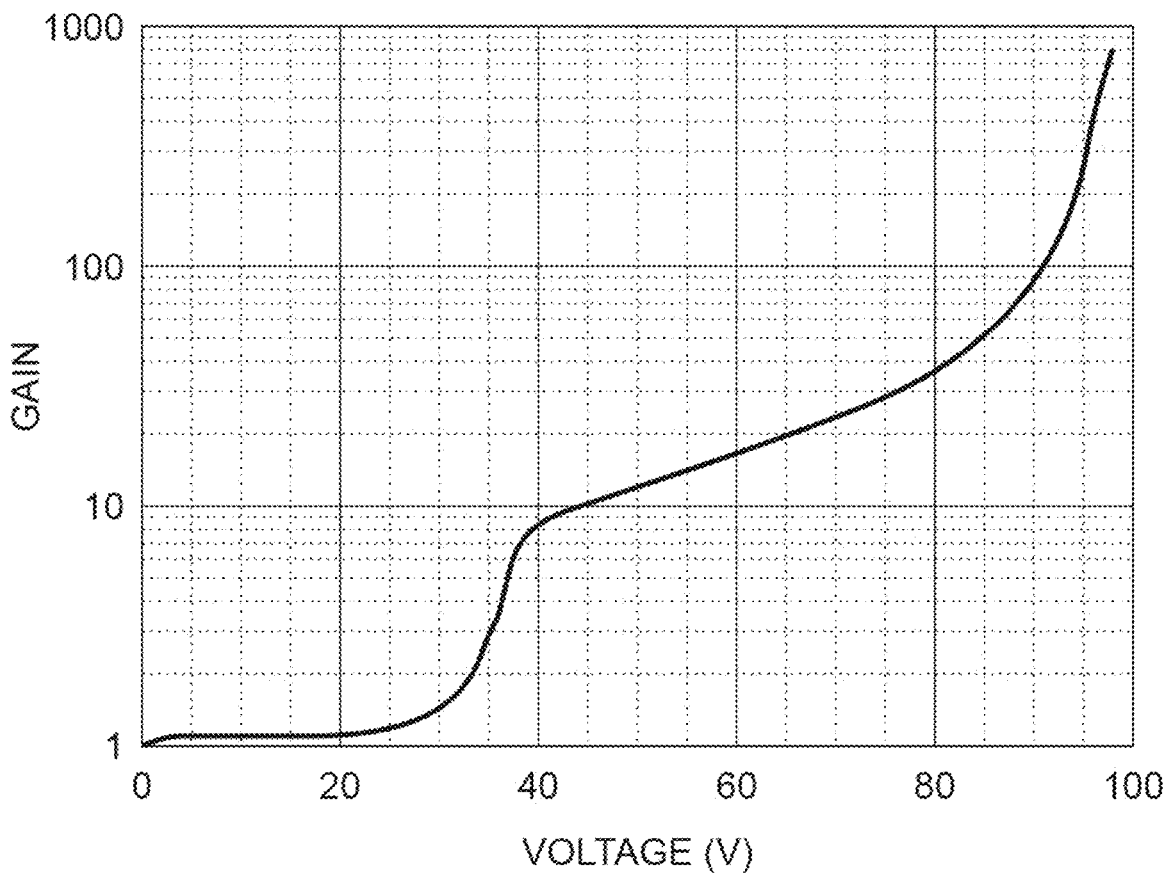
FIG. 7 is a diagram illustrating characteristics of an avalanche photodiode.

Next, an operation of each photodetection unit 15 in the present embodiment will be described with reference to FIGS. 6 and 7. FIG. 6 is a timing chart of control signals of photodetection units different from each other. FIG. 7 is a diagram illustrating characteristics of the APD.

The light reception unit 3 operates the plurality of signal output units U at different timings. The switch control unit 75 outputs a control signal for commanding light detection to the photodetection unit 15 of each signal output unit U. The photodetection unit 15 of each signal output unit U operates based on the control signal output from the switch control unit 75. The control signal output from the switch control unit 75 instructs each photodetection unit 15 on timing of photodetection. In the present embodiment, this control signal is synchronized with timing at which the laser light B1 is emitted from the irradiation unit 2.

FIG. 6 illustrates signals S1, S2, S3, and S4 as the control signal output from the switch control unit 75. The signals S1, S2, S3, and S4 have different waveforms. For example, the light reception unit 3 operates four groups of signal output units U at different timings according to the signals S1, S2, S3, and S4 from the switch control unit 75. In the present embodiment, each signal output unit U includes the plurality of photodetection units 15. The switch control unit 75 outputs signals having the same waveform to photodetection units 15 included in the same signal output unit in the signal output units U.

Each of the signals S1, S2, S3, and S4 is, for example, a HighLow signal. When the signals S1, S2, S3, and S4 input to the signal output unit U are High, the photodetection unit 15 included in the signal output unit U detects the light to be measured B2. When the signals S1, S2, S3, and S4 input to the signal output unit U are Low, the photodetection unit 15 included in the signal output unit U does not detect the light to be measured B2.

For example, as illustrated in FIG. 6, at the timing when the signal S1 falls from a High state to a Low state, the signal S2 rises from a Low state to a High state. As a result, at the timing when the photodetection unit 15 of the signal output unit U to which the signal S1 is input ends detection of the light to be measured B2, the photodetection unit 15 of the signal output unit U to which the signal S2 is input starts detection of the light to be measured B2. At the timing when the signal S2 falls from the High state to the Low state, the signal S3 rises from a Low state to a High state. As a result, at the timing when the photodetection unit 15 of the signal output unit U to which the signal S2 is input ends detection of the light to be measured B2, the photodetection unit 15 of the signal output unit U to which the signal S3 is input starts detection of the light to be measured B2.

When the photodetection unit 15 detects the light to be measured B2, the switch control unit 75 causes the switch 66 to connect the electrode 11$b$ and the second terminal 62 to each other, and causes the switch 67 to disconnect the electrode 11$b$ from the third terminal 63. When the photodetection unit 15 does not detect the light to be measured B2, the switch control unit 75 causes the switch 66 to disconnect the electrode 11$b$ from the second terminal 62, and causes the switch 67 to connect the electrode 11$b$ and the third terminal 63 to each other. In other words, when the photodetection unit 15 detects the light to be measured B2, the switch control unit 75 puts the switch 66 in the conductive state and puts the switch 67 in the cutoff state. When the photodetection unit 15 does not detect the light to be measured B2, the switch control unit 75 puts the switch 66 in the cutoff state and puts the switch 67 in the conductive state.

For example, the switch 66 is in the conductive state when the control signal from the switch control unit 75 is in the High state, and is in the cutoff state when the control signal from the switch control unit 75 is in the Low state. The switch 67 is in the conductive state when the control signal from the switch control unit 75 is in the Low state, and is in the cutoff state when the control signal from the switch control unit 75 is in the High state.

A first potential is applied to the first terminal 61. A second potential is applied to the second terminal 62. A third potential is applied to the third terminal 63. A voltage corresponding to a potential difference between the first potential and the third potential or a voltage corresponding to a potential difference between the first potential and the second potential is applied to the APD 11. An absolute value of the potential difference between the first potential and the third potential is smaller than an absolute value of the potential difference between the first potential and the second potential. The potential difference between the first potential and the second potential and the potential difference between the first potential and the third potential are included in a range of an operating voltage of the TIA 71. The potential difference between the first potential and the second potential is determined according to a multiplication factor set for the APD 11. In the present embodiment, the first potential is lower than the second potential and the third potential, and the third potential is lower than the second potential.

The voltage applied to the APD 11 is switched under the control of the switch control unit 75. When the photodetection unit 15 detects the light to be measured B2, the electrode 11$b$ and the second terminal 62 are connected to each other by the switch 66, and the electrode 11$b$ and the third terminal 63 are disconnected from each other by the switch 67. As a result, a voltage corresponding to the potential difference between the first potential applied to the first terminal 61 and the second potential applied to the second terminal 62 is applied to the APD 11.

When the photodetection unit 15 does not detect the light to be measured B2, the electrode 11$b$ and the second terminal 62 are disconnected from each other by the switch 66, and the electrode 11$b$ and the third terminal 63 are connected to each other by the switch 67. As a result, a voltage corresponding to the potential difference between the first potential applied to the first terminal 61 and the third potential applied to the third terminal 63 is applied to the APD 11.

In the present embodiment, for example, −60 V is applied to the first terminal 61 as the first potential. For example, +10 V is applied to the second terminal 62 as the second potential. For example, 0 V is applied to the third terminal 63 as the third potential. In this case, the ground may be connected to the third terminal 63. When the photodetection unit 15 detects the light to be measured B2, a voltage of 70 V is applied to the APD 11 as a bias voltage. When the photodetection unit 15 does not detect the light to be measured B2, a voltage of 60 V is applied to the APD 11 as a bias voltage.

FIG. 7 illustrates an example of characteristics of the APD 11. In FIG. 7, a horizontal axis indicates a bias voltage in the APD 11, and a vertical axis indicates gain in the APD 11. In this case, the gain in the APD 11 is about 24 times when the light to be measured B2 is detected, whereas the gain in the APD 11 is about 16 times when the light to be measured B2 is not detected. In this way, the gain in the APD 11 is lower when the light to be measured B2 is not detected than when the light to be measured B2 is detected.

Figure 8:
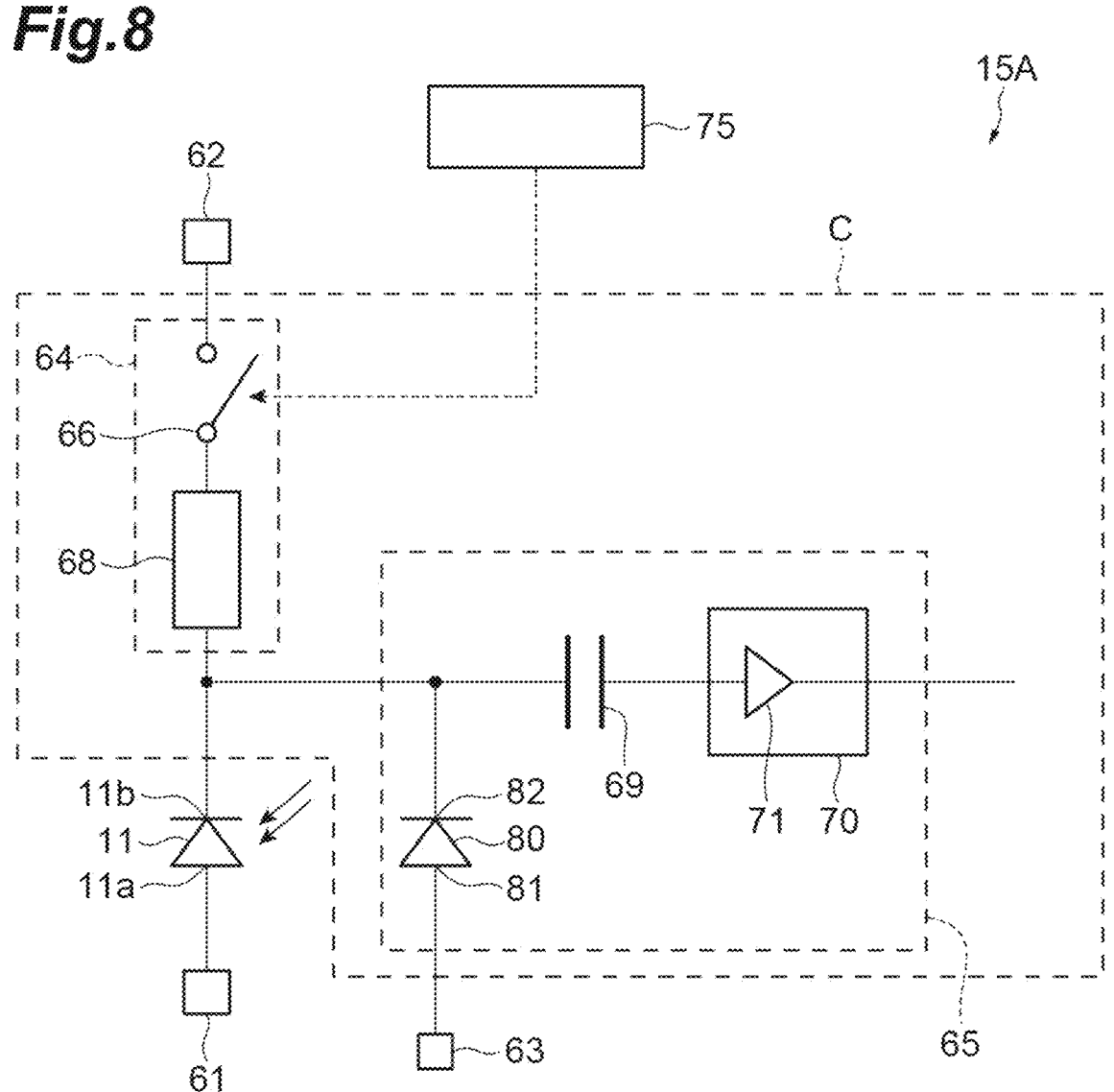
FIG. 8 is a diagram for describing a circuit of a photodetection unit in a modified example of the present embodiment.

Next, a circuit of each photodetection unit 15A in a modified example of the present embodiment will be described with reference to FIG. 8. FIG. 8 is a diagram for describing the circuit of each photodetection unit 15A in the present modified example. The present modified example is generally similar to or the same as the embodiment described above. The present modified example is different from the above-described embodiment in that a diode 80 is used instead of the switch 67. A difference between the above-described embodiment and the present modified example will be mainly described below.

Each photodetection unit 15A includes the APD 11, the first terminal 61, the second terminal 62, the third terminal 63, the first circuit unit 64, and a second circuit unit 65A. Therefore, the photodetection unit 15A is different from the photodetection unit 15 in that the second circuit unit 65 is the second circuit unit 65A.

The second circuit unit 65A includes the diode 80, a capacitor 69, and a reading circuit 70. The diode 80 includes an electrode 81 and an electrode 82. The electrode 81 of the diode 80 has the same polarity as the electrode 1$b$ of the APD 11. The electrode 82 of the diode 80 has the same polarity as the electrode 11$a$ of the APD 11. The electrode 81 of the diode 80 is connected to the electrode 11$b$. The electrode 82 of the diode 80 is connected to the third terminal 63. The diode 80 and the capacitor 69 are connected in parallel with each other to the electrode 11$b$. The electrode 11$b$, the diode 80, and the third terminal 63 are connected in series with each other. When the electrode 81 corresponds to a fourth electrode, the electrode 82 corresponds to a third electrode.

In the present embodiment, the electrode 81 connected to the electrode 11$b$ is an anode of the diode 80. The electrode 82 connected to the third terminal 63 is a cathode of the diode 80. As a modified example of the present embodiment, when the polarity of the APD 11 is reversed as in a modified example described later using FIG. 9, the cathode of the diode 80 is connected to the electrode 11*b* as the electrode 81, and the anode of the diode 80 is connected to the third terminal 63 as the electrode 82.

In the present modified example, a switch 66, a resistor 68, the diode 80, the capacitor 69, and the TIA 71 are included in one integrated circuit C. The switch 66, the resistor 68, the diode 80, the capacitor 69, and the TIA 71 may be included in different integrated circuits, respectively. At least the TIA 71 is included in a CMOS logic integrated circuit.

A first potential is applied to the first terminal 61. A second potential is applied to the second terminal 62. A third potential is applied to the third terminal 63. An absolute value of a potential difference between the first potential and the third potential is smaller than an absolute value of a potential difference between the first potential and the second potential. The potential difference between the first potential and the second potential and the potential difference between the first potential and the third potential are included in a range of an operating voltage of the TIA 71. The potential difference between the first potential and the second potential is determined according to the multiplication factor set for the APD 11.

The voltage applied to the APD 11 is switched under the control of the switch control unit 75. When the photodetection unit 15A detects the light to be measured B2, the electrode 11*b* and the second terminal 62 are connected to each other by the switch 66. In the present embodiment, the first potential is lower than the second potential and the third potential, and the third potential is lower than the second potential. As a result, a voltage corresponding to the potential difference between the first potential applied to the first terminal 61 and the second potential applied to the second terminal 62 is applied to the APD 11.

When the photodetection unit 15A does not detect the light to be measured B2, the electrode 11*b* and the second terminal 62 are disconnected from each other by the switch 66. In the present embodiment, the first potential is lower than the second potential and the third potential, and the third potential is lower than the second potential. As a result, a voltage corresponding to the potential difference between the first potential applied to the first terminal 61 and the third potential applied to the third terminal 63 is applied to the APD 11.

In the present embodiment, for example, –60 V is applied to the first terminal 61 as the first potential. For example, +10 V is applied to the second terminal 62 as the second potential. For example, 0 V is applied to the third terminal 63 as the third potential. In this case, the ground may be connected to the third terminal 63. When the photodetection unit 15A detects the light to be measured B2, a voltage of 70 V is applied to the APD 11 as a bias voltage. When the photodetection unit 15 does not detect the light to be measured B2, a voltage of 60 V is applied to the APD 11 as a bias voltage. As described above, in each photodetection unit 15A, the gain in the APD 11 is lower when the light to be measured B2 is not detected than when the light to be measured B2 is detected.

Figure 9:
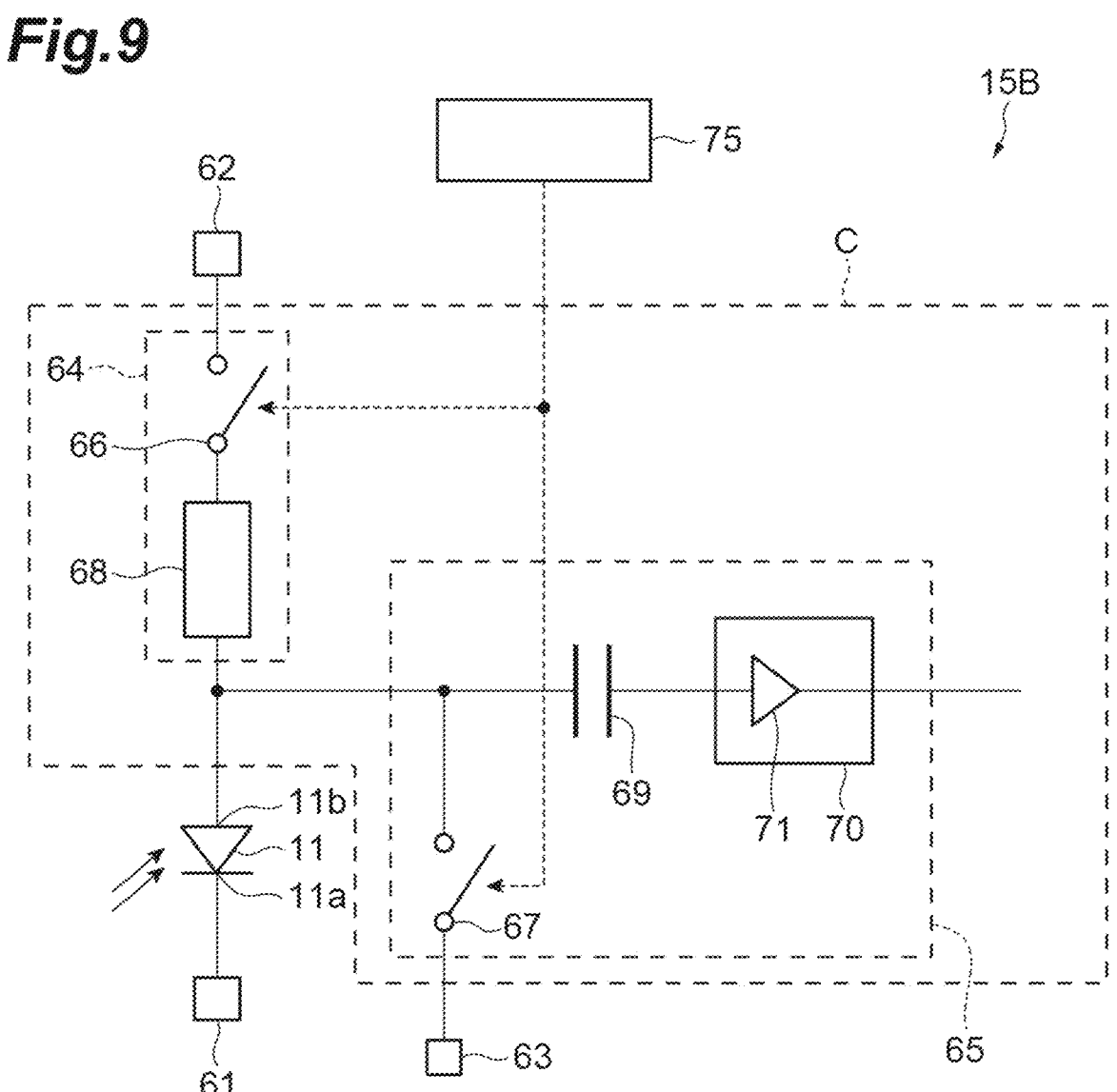
FIG. 9 is a diagram for describing a circuit of a photodetection unit in a modified example of the present embodiment.

Next, a circuit of each photodetection unit 15B in a modified example of the present embodiment will be described with reference to FIG. 9. FIG. 9 is a diagram for describing the circuit of each photodetection unit 15B in the present modified example. The present modified example is generally similar to or the same as the embodiment described above. The present modified example is different from the above-described embodiment in that the polarity of the APD is reversed. A difference between the above-described embodiment and the present modified example will be mainly described below.

In each photodetection unit 15B, the APD 11 includes the electrode 11*a* and the electrode 11*b*. The electrode 11*a* is connected to the first terminal 61. The electrode 11*b* is connected to the first circuit unit 64 and the second circuit unit 65. In each photodetection unit 15B, the electrode 11*a* is the cathode of the APD 11. In the present modified example, the electrode 11*a* corresponds to the pad electrode connected to the N-type semiconductor of the APD 11. The electrode 11*b* is the anode of the APD 11. The electrode 11*b* corresponds to the pad electrode connected to the P-type semiconductor of the APD 11.

A first potential is applied to the first terminal 61. A second potential is applied to the second terminal 62. A third potential is applied to the third terminal 63. An absolute value of a potential difference between the first potential and the third potential is smaller than an absolute value of a potential difference between the first potential and the second potential. The potential difference between the first potential and the second potential and the potential difference between the first potential and the third potential are included in the range of the operating voltage of the TIA 71. The potential difference between the first potential and the second potential is determined according to the multiplication factor set for the APD 11. In the present embodiment, the first potential is higher than the second potential and the third potential, and the third potential is higher than the second potential.

The voltage applied to the APD 11 is switched under the control of the switch control unit 75. When the photodetection unit 15B detects the light to be measured B2, the electrode 11*b* and the second terminal 62 are connected to each other by the switch 66, and the electrode 11*b* and the third terminal 63 are disconnected from each other by the switch 67. As a result, a voltage corresponding to the potential difference between the first potential applied to the first terminal 61 and the second potential applied to the second terminal 62 is applied to the APD 11.

When the photodetection unit 15B does not detect the light to be measured B2, the electrode 11*b* and the second terminal 62 are disconnected from each other by the switch 66, and the electrode 11*b* and the third terminal 63 are connected to each other by the switch 67. As a result, a voltage corresponding to the potential difference between the first potential applied to the first terminal 61 and the third potential applied to the third terminal 63 is applied to the APD 11.

In the present modified example, for example, +70 V is applied to the first terminal 61 as the first potential. For example, 0 V is applied to the second terminal 62 as the second potential. For example, +12 V is applied to the third terminal 63 as the third potential. In this case, the ground may be connected to the second terminal 62. When the photodetection unit 15 detects the light to be measured B2, a voltage of 70 V is applied to the APD 11 as a bias voltage. When the photodetection unit 15 does not detect the light to be measured B2, a voltage of 58 V is applied to the APD 11 as a bias voltage. As described above, in each photodetection unit 15B, the gain in the APD 11 is lower when the light to be measured B2 is not detected than when the light to be measured B2 is detected.

Next, effects of the photodetection device 1 will be described. In each of the photodetection units 15 and 15B, the first terminal 61 is connected to the electrode 11*a* of the APD 11. The switch 66 switches the connection state between the electrode 11b of the APD 11 and the second terminal 62. The switch 67 switches the connection state between the electrode 11b of the APD 11 and the third terminal 63. Therefore, the photodetection device 1 can switch the bias voltage to the APD 11 from the potential difference between the first potential applied to the first terminal 61 and the second potential applied to the second terminal 62 to the potential difference between the first potential applied to the first terminal 61 and the third potential applied to the third terminal 63.

If the bias voltage applied to the APD 11 when photodetection is not performed is lower than the bias voltage applied to the APD 11 when photodetection is performed, heat generation of the APD 11 due to incident ambient light, etc. is suppressed when photodetection is not performed. For example, in the photodetection units 15 and 15B of the photodetection device 1, when the potential difference between the first potential and the second potential is lower than the potential difference between the first potential and the third potential, if the switch 66 is in the cutoff state, and the switch 67 is in the conductive state, the bias voltage applied to the APD 11 is lowered. As a result, heat generation of the APD 11 due to incident light is suppressed.

The bias voltage applied to the APD 11 is switched between the potential difference between the first potential and the second potential and the potential difference between the first potential and the third potential. Therefore, when compared to the case where a state in which the bias voltage is applied to the APD 11 and a state in which the bias voltage is not applied to the APD 11 are switched, fluctuation of the bias voltage in the APD 11 is small. As a result, fluctuation in the potential applied to the reading circuit 70 is suppressed, and thus damage to the reading circuit 70 is suppressed.

In the photodetection unit 15A, the first terminal 61 is connected to the electrode 11a of the APD 11. The switch 66 switches the connection state between the electrode 11b of the APD 11 and the second terminal 62. The electrode 81 of the diode 80 is connected to the electrode 11b, and the electrode 82 of the diode 80 is connected to the third terminal 63. The electrode 81 has the same polarity as the electrode 11b. The electrode 82 has the same polarity as the electrode 11a. Therefore, the photodetection device 1 can switch the bias voltage to the APD 11 from the potential difference between the first potential applied to the first terminal 61 and the second potential applied to the second terminal 62 to the potential difference between the first potential applied to the first terminal 61 and the third potential applied to the third terminal 63.

For example, in the photodetection unit 15A of the photodetection device 1, when the potential difference between the first potential and the second potential is lower than the potential difference between the first potential and the third potential, if the switch 66 is in the cutoff state, the bias voltage applied to the APD 11 decreases. As a result, heat generation of the APD 11 due to incident light is suppressed. The bias voltage applied to the APD 11 is switched between the potential difference between the first potential and the second potential and the potential difference between the first potential and the third potential. Therefore, when compared to the case where the state in which the bias voltage is applied to the APD 11 and the state in which the bias voltage is not applied to the APD 11 are switched, fluctuation of the bias voltage in the APD 11 is small. As a result, fluctuation in the potential applied to the reading circuit 70 is suppressed, and thus damage to the reading circuit 70 is suppressed.

In each of the photodetection units 15, 15A, and 15B, the switch 66 is connected to the electrode 11b via the resistor 68. In this case, an influence of parasitic capacitance generated in the switch 66 is reduced.

In each of the photodetection units 15, 15A, and 15B, the TIA 71 is included in the CMOS logic integrated circuit. When the TIA 71 is included in the CMOS logic integrated circuit, the TIA can operate at a relatively high speed. However, in the CMOS logic integrated circuit, a range of an operating voltage is limited. With the above configuration, the bias voltage applied to the APD 11 can be changed while the voltage applied to the CMOS logic integrated circuit is within the range of the operating voltage. Therefore, while an operation speed of the TIA 71 is improved, heat generation of the APD 11 and damage to the reading circuit 70 due to voltage fluctuation can be suppressed.

Each of the photodetection units 15 and 15B can operate at a relatively low operating voltage of, for example, 20 V or less, even in a configuration in which all the switch 66, the resistor 68, the switch 67, the capacitor 69, and the TIA 71 are included in the same CMOS logic integrated circuit. In other words, the TIA 71 can operate at a relatively high speed in the configuration in which all the switch 66, the resistor 68, the switch 67, the capacitor 69, and the TIA 71 are included in the same integrated circuit.

Each photodetection unit 15A can operate at a relatively low operating voltage of, for example, 20 V or less, even in a configuration in which all the switch 66, the resistor 68, the diode 80, the capacitor 69, and the TIA 71 are included in the same CMOS logic integrated circuit. In other words, the TIA 71 can operate at a relatively high speed in the configuration in which all the switch 66, the resistor 68, the diode 80, the capacitor 69, and the TIA 71 are included in the same integrated circuit.

In each of the photodetection units 15, 15A, and 15B, the resistor 68 has impedance greater than the input impedance of the second circuit unit 65. In this case, a signal from the APD 11 can be more accurately transmitted to the TIA 71.

In each of the photodetection units 15, 15A, and 15B, the potential difference between the first potential and the second potential and the potential difference between the first potential and the third potential may be included in the range of the operating voltage of the TIA 71. In this case, with a simple configuration, the operation speed of the TIA 71 can be improved, while heat generation of the APD 11 and damage to the reading circuit 70 due to voltage fluctuation can be suppressed.

The photodetection device 1 further includes the switch control unit 75 that controls the connection state of each of the switch 66 and the switch 67 according to the timing of photodetection in each of the photodetection units 15, 15A, and 15B. In this case, the photodetection device 1 can switch the bias voltage to the APD 11 depending on whether or not it is the timing to perform photodetection.

For each of the photodetection units 15 and 15B, the switch control unit 75 causes the switch 67 to connect the electrode 11b and the third terminal 63 to each other in a state in which the switch 66 disconnects the electrode 11b and the second terminal 62 from each other. In this case, when the ambient light B3 enters the APD 11 that does not detect the light to be measured B2, the photodetection device 1 can discharge a generated current to the third terminal 63. As a result, damage to the reading circuit 70 is suppressed.

For each of the photodetection units 15 and 15B, the switch control unit 75 causes the switch 67 to disconnect the electrode 11*b* and the third terminal 63 from each other in a state in which the switch 66 connects the electrode 11*b* and the second terminal 62 to each other. In this case, heat generation in the resistor 68 is suppressed.

The photodetection device 1 may further include the irradiation unit 2 that applies light. The switch control unit 75 controls the energized states of the switch 66 and the switch 67 according to the timing at which light is applied from the irradiation unit 2. In this case, the photodetection device 1 can more reliably determine whether or not it is the timing to perform photodetection. As a result, the photodetection device 1 can more accurately switch the bias voltage to the APD 11 depending on whether or not it is the timing to perform photodetection.

Even though the embodiment and the modified examples of the invention have been described above, the invention is not necessarily limited to the above-described embodiment, and various modifications can be made without departing from the gist of the invention.

For example, in the embodiment and the modified examples described above, the APD 11 operates in a linear mode. However, APD 11 may operate in a Geiger mode. In this case, each photodetection unit may further include a quenching circuit connected to the APD 11. The quenching circuit may be provided on the photodetection substrate 5 or may be provided on the circuit element 7. The quenching circuit may be provided integrally with the resistor 68.

For example, in the embodiment and the modified examples described above, the photodetection substrate 5 and the circuit element 7 are separated from each other and disposed to face each other in the Z-axis direction. However, the photodetection substrate 5 and the circuit element 7 may be integrally configured. The photodetection substrate 5 and the circuit element 7 may be arranged in a direction intersecting the Z-axis direction.

In the embodiment and the modified examples described above, the photodetection substrate 5 and the circuit element 7 are connected via the bump B. However, the photodetection substrate 5 and the circuit element 7 may be directly joined together.

In the embodiment and the modified examples described above, the switch control unit 75 controls each of the switch 66 and the switch 67. However, the switch 66 and the switch 67 may be interlocked. For example, the switch 66 and the switch 67 may include a CMOS.

In each of the photodetection unit 15 and the photodetection unit 15B, when the photodetection unit 15 detects the light to be measured B2, the switch control unit 75 puts the switch 66 in the conductive state, and puts the switch 67 in the cutoff state. When the photodetection unit 15 does not detect the light to be measured B2, the switch control unit 75 puts the switch 66 in the cutoff state, and puts the switch 67 in the conductive state. However, when the photodetection unit 15 does not detect the light to be measured B2, both the switch 66 and the switch 67 may be put in the conductive state. In this case, the bias voltage applied to the APD 11 is lower than that when the switch 66 is in the conductive state and the switch 67 is in the cutoff state. Fluctuation in the bias voltage in the APD 11 is smaller than that in the case of switching between the state in which the bias voltage is applied to the APD 11 and the state in which the bias voltage is not applied to the APD 11. As a result, heat generation of the APD 11 due to incident light and damage to the reading circuit 70 due to fluctuation in the potential are suppressed. Heat generation in the resistor 68 is suppressed more when the switch 66 is in the cutoff state and the switch 67 is in the conductive state than when both the switch 66 and the switch 67 are in the conductive state.

The respective modified examples described above may be combined. For example, in each photodetection unit 15B, the diode 80 may be used instead of the switch 67 as in the photodetection unit 15A.

REFERENCE SIGNS LIST

1: photodetection device, 2: irradiation unit, 11: avalanche photodiode, 11*a*, 11*b*: electrode, 15, 15A, 15B: photodetection unit, 61: first terminal, 62: second terminal, 63: third terminal, 64: first circuit unit, 65, 65A: second circuit unit, 66, 67: switch, 68: resistor, 69: capacitor, 70: reading circuit, 71: transimpedance amplifier, 75: switch control unit, 80: diode, 81, 82: electrode, R: light reception region.

The invention claimed is:

1. A photodetection device comprising a plurality of photodetection units each having a light reception region, wherein:
   each of the photodetection unit includes:
   an avalanche photodiode including first and second electrodes and forming the light reception region;
   a first terminal connected to the first electrode and to which a first potential is applied;
   first and second circuit units connected in parallel with each other to the second electrode;
   a second terminal connected to the second electrode via the first circuit unit and to which a second potential is applied; and
   a third terminal connected to the second electrode via the second circuit unit and to which a third potential is applied, and
   in each of the photodetection units:
   the first circuit unit includes a resistor and a first switch for switching a connection state between the second electrode and the second terminal;
   the first switch, the resistor, the second electrode, and the second terminal are connected in series with each other;
   the second circuit unit includes a second switch for switching a connection state between the second electrode and the third terminal, a capacitor, and a reading circuit including a transimpedance amplifier;
   the second switch and the capacitor are connected in parallel with each other to the second electrode;
   the second switch, the second electrode, and the third terminal are connected in series with each other;
   the transimpedance amplifier is connected in series with the capacitor and is connected to the second electrode via the capacitor; and
   an absolute value of a potential difference between the first potential and the third potential is smaller than an absolute value of a potential difference between the first potential and the second potential.

2. The photodetection device according to claim 1, wherein, in each of the photodetection units, the first switch is connected to the second electrode via the resistor.

3. The photodetection device according to claim 1, further comprising a switch control unit configured to control the connection states by the first and second switches according to timing of photodetection in each of the photodetection units.

4. The photodetection device according to claim 3, wherein the switch control unit causes the second switch to connect the second electrode and the third terminal to each other in a state in which the first switch disconnects the second electrode and the second terminal from each other.

5. The photodetection device according to claim 3, wherein the switch control unit causes the second switch to disconnect the second electrode and the third terminal from each other in a state in which the first switch connects the second electrode and the second terminal to each other.

6. The photodetection device according to claim 3, further comprising an irradiation unit configured to apply light, wherein the switch control unit controls an energized state of each of the first and second switches according to timing when the light is applied from the irradiation unit.

7. A photodetection device comprising a plurality of photodetection units each having a light reception region, wherein:

each of the photodetection unit includes:

an avalanche photodiode including first and second electrodes and forming the light reception region;

a first terminal connected to the first electrode and to which a first potential is applied;

first and second circuit units connected in parallel with each other to the second electrode;

a second terminal connected to the second electrode via the first circuit unit and to which a second potential is applied; and a third terminal connected to the second electrode via the second circuit unit and to which a third potential is applied, and in each of the photodetection units:

the first circuit unit includes a resistor and a switch for switching a connection state between the second electrode and the second terminal;

the switch, the resistor, the second electrode, and the second terminal are connected in series with each other;

the second circuit unit includes a diode, a capacitor, and a reading circuit including a transimpedance amplifier;

the diode and the capacitor are connected in parallel with each other to the second electrode;

the diode includes a third electrode having the same polarity as the first electrode of the avalanche photodiode and a fourth electrode having the same polarity as the second electrode of the avalanche photodiode;

the third electrode of the diode is connected to the third terminal;

the fourth electrode of the diode is connected to the second electrode;

the transimpedance amplifier is connected in series with the capacitor and is connected to the second electrode via the capacitor; and an absolute value of a potential difference between the first potential and the third potential is smaller than an absolute value of a potential difference between the first potential and the second potential.

8. The photodetection device according to claim 7, wherein, in each of the photodetection units, the switch is connected to the second electrode via the resistor.

9. The photodetection device according to claim 1, wherein the transimpedance amplifier is included in a CMOS logic integrated circuit.

10. The photodetection device according to claim 1, wherein the resistor has impedance greater than input impedance of the second circuit unit.

11. The photodetection device according to claim 1, wherein the potential difference between the first potential and the second potential and the potential difference between the first potential and the third potential are included in a range of an operating voltage of the transimpedance amplifier.

12. A photodetection device comprising:

an avalanche photodiode including first and second electrodes;

a first terminal connected to the first electrode;

first and second circuit units connected in parallel with each other to the second electrode;

a second terminal connected to the second electrode via the first circuit unit; and a plurality of photodetection units each including a third terminal connected to the second electrode via the second circuit unit, wherein, in each of the photodetection units:

the first circuit unit includes a resistor and a first switch for switching a connection state between the second electrode and the second terminal;

the first switch, the resistor, the second electrode, and the second terminal are connected in series with each other;

the second circuit unit includes a second switch for switching a connection state between the second electrode and the third terminal, a capacitor, and a reading circuit including a transimpedance amplifier;

the second switch and the capacitor are connected in parallel with each other to the second electrode;

the second switch, the second electrode, and the third terminal are connected in series with each other; and the transimpedance amplifier is connected in series with the capacitor and is connected to the second electrode via the capacitor.

13. A photodetection device comprising:

an avalanche photodiode including first and second electrodes;

a first terminal connected to the first electrode;

first and second circuit units connected in parallel with each other to the second electrode;

a second terminal connected to the second electrode via the first circuit unit; and a plurality of photodetection units each including a third terminal connected to the second electrode via the second circuit unit, wherein, in each of the photodetection units:

the first circuit unit includes a resistor and a switch for switching a connection state between the second electrode and the second terminal;

the switch, the resistor, the second electrode, and the second terminal are connected in series with each other;

the second circuit unit includes a diode, a capacitor, and a reading circuit including a transimpedance amplifier;

the diode and the capacitor are connected in parallel with each other to the second electrode;

the diode includes a third electrode having the same polarity as the first electrode of the avalanche photodiode and a fourth electrode having the same polarity as the second electrode of the avalanche photodiode;

the third electrode of the diode is connected to the third terminal;

the fourth electrode of the diode is connected to the second electrode; and the transimpedance amplifier is connected in series with the capacitor and is connected to the second electrode via the capacitor.

* * * * *